(12) United States Patent
Curuvija et al.

(10) Patent No.: US 11,046,189 B2
(45) Date of Patent: Jun. 29, 2021

(54) INTEGRATED CHARGE AND DISCHARGE SOLUTION FOR INVERTER DC LINK CAPACITOR

(71) Applicant: Ford Global Technologies, LLC, Dearborn, MI (US)

(72) Inventors: Boris Curuvija, Dearborn Heights, MI (US); Lihua Chen, Farmington Hills, MI (US); Baoming Ge, Okemos, MI (US); Fan Xu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 167 days.

(21) Appl. No.: 16/246,011

(22) Filed: Jan. 11, 2019

(65) Prior Publication Data

US 2020/0223314 A1 Jul. 16, 2020

(51) Int. Cl.
| | | |
|---|---|---|
| *B60L 3/00* | (2019.01) | |
| *G01R 31/327* | (2006.01) | |
| *H02J 7/00* | (2006.01) | |
| *B60L 3/04* | (2006.01) | |
| *G01R 31/64* | (2020.01) | |
| *H02M 7/5387* | (2007.01) | |
| *H02M 1/32* | (2007.01) | |
| *B60L 50/60* | (2019.01) | |

(Continued)

(52) U.S. Cl.
CPC ........... *B60L 3/0046* (2013.01); *B60L 3/0069* (2013.01); *B60L 3/04* (2013.01); *B60L 50/40* (2019.02); *B60L 50/60* (2019.02); *G01R 31/3275* (2013.01); *G01R 31/3278* (2013.01); *G01R 31/64* (2020.01); *H01M 10/44* (2013.01); *H02J 7/007* (2013.01); *H02J 7/0063* (2013.01); *H02J 7/00304* (2020.01); *H02M 1/32* (2013.01); *H02M 7/53871* (2013.01); *H02M 2001/322* (2013.01)

(58) Field of Classification Search
CPC ............... G01R 31/64; G01R 31/3275; G01R 31/3278; H01M 10/44; H02J 7/00304; H02J 7/0063; H02J 7/007; H02M 2001/322; H02M 7/53871; H02M 1/32; B60L 50/40; B60L 50/60; B60L 3/0069; B60L 3/0046; H02H 7/1222
USPC .......................... 307/9.1, 10.1; 318/139, 106
See application file for complete search history.

(56) References Cited

U.S. PATENT DOCUMENTS

| | | | | |
|---|---|---|---|---|
| 7,626,354 B2 * | 12/2009 | Hanyu | ..................... | B60K 6/52 320/104 |
| 8,901,934 B2 | 12/2014 | Namou et al. | | |

(Continued)

FOREIGN PATENT DOCUMENTS

| | | | |
|---|---|---|---|
| DE | 102016005732 A1 | 11/2017 | |
| WO | 2017158375 A1 | 9/2017 | |
| WO | WO-2018186573 A1 * | 10/2018 | ................ H02J 7/00 |

*Primary Examiner* — Arnold M Kinkead
(74) *Attorney, Agent, or Firm* — David B. Kelley; Brooks Kushman P.C.

(57) ABSTRACT

A controller of a vehicle power system closes a pre-charge contactor and one of a pair of main contactors to electrically connect a battery and inverter such that current flows through a pre-charge resistor. The controller also opens the pair to electrically disconnect the battery and inverter, and closes a switch configured to complete a circuit such that charge acquired by a capacitor of the inverter is dissipated via the pre-charge resistor.

13 Claims, 3 Drawing Sheets

(51) Int. Cl.
*B60L 50/40* (2019.01)
*H01M 10/44* (2006.01)

(56) References Cited

U.S. PATENT DOCUMENTS

| | | | |
|---|---|---|---|
| 2012/0191294 A1* | 7/2012 | Boiron | G01R 31/3278 |
| | | | 701/33.8 |
| 2014/0028088 A1* | 1/2014 | Salziger | H02J 7/00 |
| | | | 307/9.1 |
| 2015/0185271 A1* | 7/2015 | Kim | G01R 31/64 |
| | | | 324/551 |
| 2019/0204388 A1* | 7/2019 | Hamamoto | H01M 10/44 |
| 2020/0122584 A1* | 4/2020 | Zhang | B60L 53/60 |
| 2020/0122655 A1* | 4/2020 | Kim | B60L 3/0046 |
| 2020/0209314 A1* | 7/2020 | Bonetti | B60L 3/12 |

* cited by examiner

INTEGRATED CHARGE AND DISCHARGE SOLUTION FOR INVERTER DC LINK CAPACITOR

TECHNICAL FIELD

This disclosure relates to power systems for automotive vehicles.

BACKGROUND

Electrified vehicles, including hybrid, plug-in hybrid, and electric vehicles, are designed to be propelled or partially propelled by one or several electric machines, such as AC induction machines, DC brushless electric machines, and permanent magnetic synchronous machines. Battery packs are included in the electrified vehicles to provide electricity to the electric machines. Hybrid and plug-in hybrid vehicles may also have built-in internal combustion engines that are able to charge the battery packs and/or propel the vehicles.

Battery packs may include multiple battery cells in series and/or in parallel to achieve high voltage and/or high output power to meet the requirements of the electric machines. Battery packs may also provide power to other equipment and circuits, such as DC-DC converters, on-board generators, and air conditioning systems.

SUMMARY

A vehicle includes a battery, an inverter, and a controller that closes a pre-charge contactor and one of a pair of main contactors to electrically connect the battery and inverter such that current flows through a pre-charge resistor. The controller also opens the pair to electrically disconnect the battery and inverter, and closes a switch configured to complete a circuit such that charge acquired by a capacitor of the inverter is dissipated via the pre-charge resistor.

A method includes, by a controller, closing a pre-charge contactor and one of a pair of main contactors to electrically connect a traction battery and inverter such that current from the traction battery to the inverter flows through a pre-charge resistor, and opening the pair and closing a switch configured to complete a circuit between the pre-charge resistor and a capacitor of the inverter to dissipate charge acquired by the capacitor via the pre-charge resistor.

A vehicle power system includes a traction battery, an inverter, and a controller that opens a pair of main contactors to electrically disconnect the traction battery and inverter, and then closes a switch configured to complete a circuit such that charge acquired by a capacitor of the inverter is dissipated via a pre-charge resistor electrically between the traction battery and capacitor.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
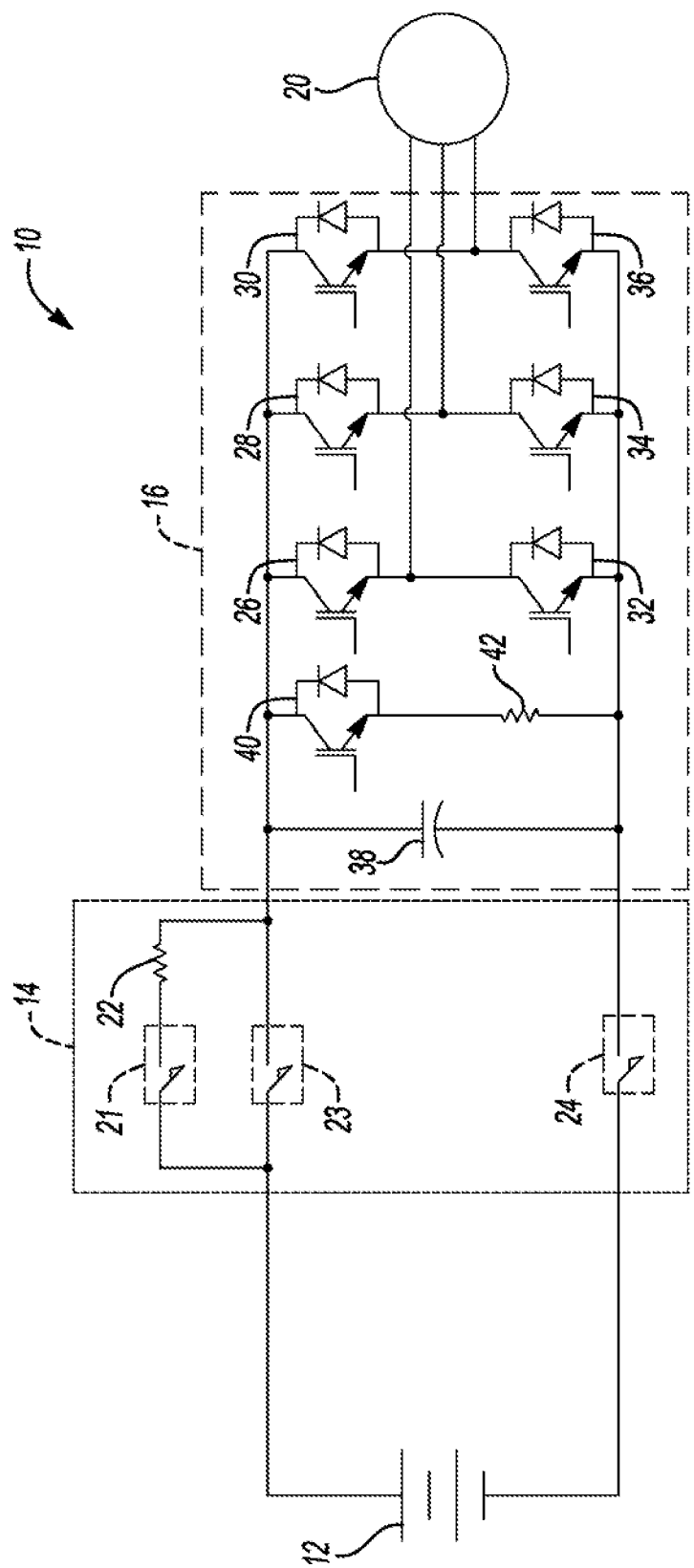
FIG. 1 is a schematic diagram of a vehicle including a power system.

With regard to FIG. 1, a vehicle. 10 includes a traction battery 12, contactor circuitry 14, an inverter 16, and an electric machine 20. Energy stored by the traction battery 12 may be used to drive the electric machine 20 via operation of the inverter 16. Likewise, energy captured by the electric machine 20, during regenerative braking for example, may be stored by the traction battery 12 via operation of the inverter 16.

The contactor circuitry 14 includes a pre-charge contactor 21, a pre-charge resistor 22, and main contactors 23, 24. The inverter 16 includes switches 26, 28, 30, 32, 34, 36, DC link capacitor 38, switch 40, and resistor 42.

To electrically connect the traction battery 12 to the inverter 16, the pre-charge contactor 21 and main contactor 24 are closed, causing the DC link capacitor 38 to slowly acquire charge due to presence of the pre-charge resistor 22. Once the DC link capacitor 38 has acquired charge sufficiently equal to that of the traction battery 12, the pre-charge contactor 21 is opened and the main contactor 23 is closed.

To electrically disconnect the traction battery 12 from the inverter 16, the main contactors 23, 24 are opened and the switch 40 is operated to discharge the DC link capacitor 38 via the resistor 42.

Typically, the switch 40 and resistor 42 are located within the inverter 16, which can take up additional space. Moreover, the resistor 42 is sometimes isolated and thermal pads are used to transfer heat therefrom to an associated housing.

Here, arrangements are proposed that utilize the pre-charge resistor to discharge the DC link capacitor once the vehicle traction inverter is shut down. This eliminates the internal resistor and moves the switch that controls the discharge outside the inverter. This also saves the number of components and eliminates the need for thermal isolation of the discharge circuit. The switch can be designed to control the current trough the pre-charge resistor and the voltage rating of the switch should be greater than the capacitor voltage. Relatively speaking however, the current rating for the switch may be low since the capacitor will discharge slowly. The switch, for example, can be a metal-oxide semiconductor field-effect transistor, an insulated-gate bipolar transistor, or a mechanical relay. The control for the switch and the pre-charge contractor is complementary.

Figure 2:
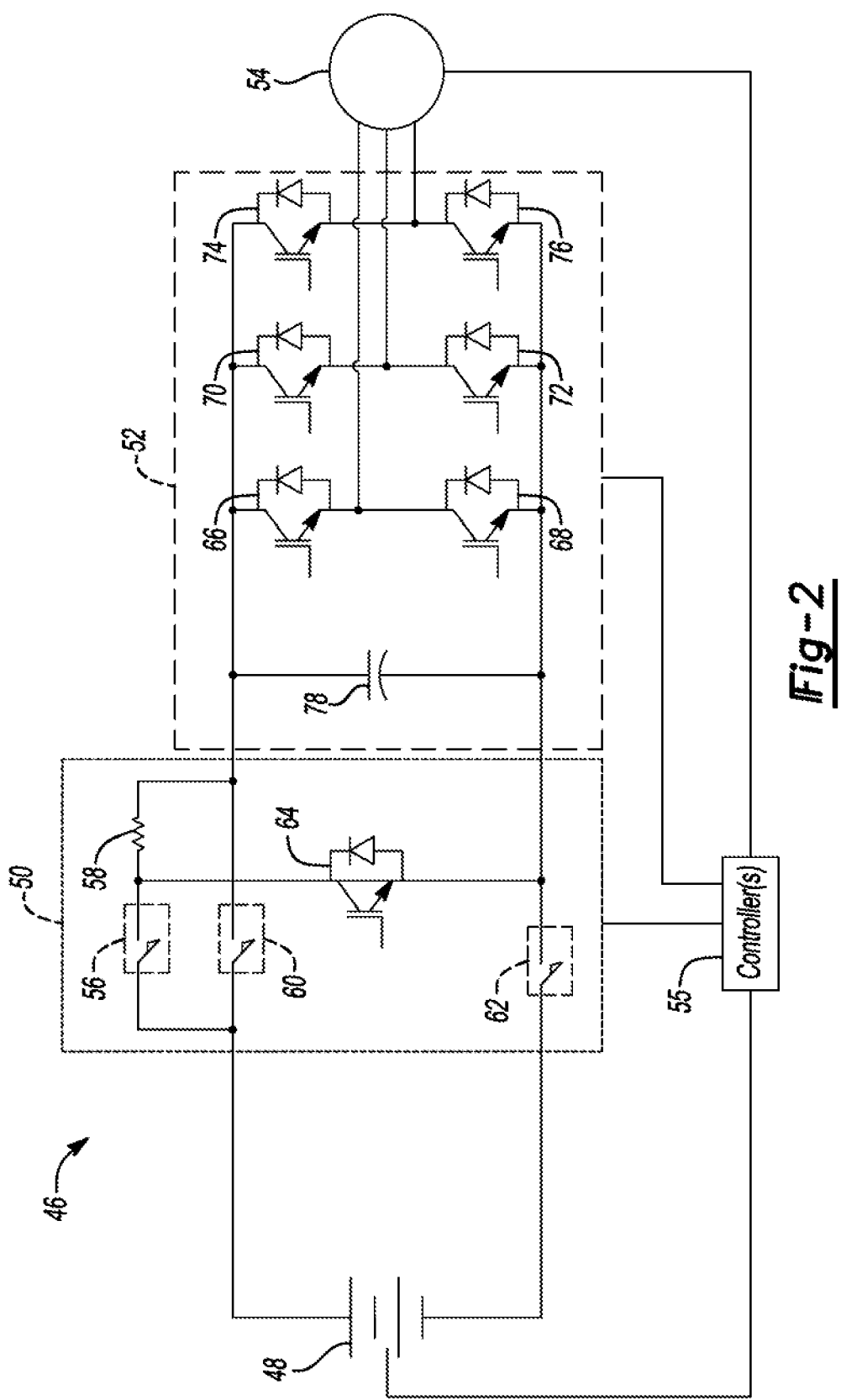
FIG. 2 is a schematic diagram of a vehicle including a power system.

With regard to FIG. 2, a vehicle 46 includes a traction battery 48, contactor circuitry 50, an inverter 52, an electric machine 54, and a controller 55. Here, the controller 55 may represent several controllers. Each of the traction battery 48, the contactor circuitry 50, the inverter 52, and the electric machine 54 are in communication with/under the control of the controller 55. Energy stored by the traction battery 48 may be used to drive the electric machine 54 via operation of the inverter 52. Likewise, energy captured by the electric machine 54, during regenerative braking for example, may be stored by the traction battery 48 via operation of the inverter 52.

The contactor circuitry 50 includes a pre-charge contactor 56, a pre-charge resistor 58, main contactors 60, 62, and switch 64. The inverter 52 includes switches 66, 68, 70, 72, 74, 76, and DC link capacitor 78.

To electrically connect the traction battery 48 to the inverter 52, the controller 55 closes the pre-charge contactor 56 and main contactor 62, causing the DC link capacitor 78 to slowly acquire charge due to presence of the pre-charge resistor 58. Once the DC link capacitor 78 has acquired charge sufficiently equal to that of the traction battery 48, the controller 55 opens the pre-charge contactor 56 and closes the main contactor 60. The switch 64 remains open during this process.

To electrically disconnect the traction battery 48 from the inverter 52, the controller 55 opens the main contactors 60, 62 and closes the switch 64 such that charge acquired by the DC link capacitor 38 is dissipated via the pre-charge resistor 58 via current flow through the pre-charge resistor 58. The controller 55 may monitor the charge on the DC link capacitor 78 via known techniques such as sensors and the like, and open the switch 64 responsive to the charge falling below a target level or responsive to passage of a predetermined amount of time since opening the main contactors 60, 62.

Figure 3:
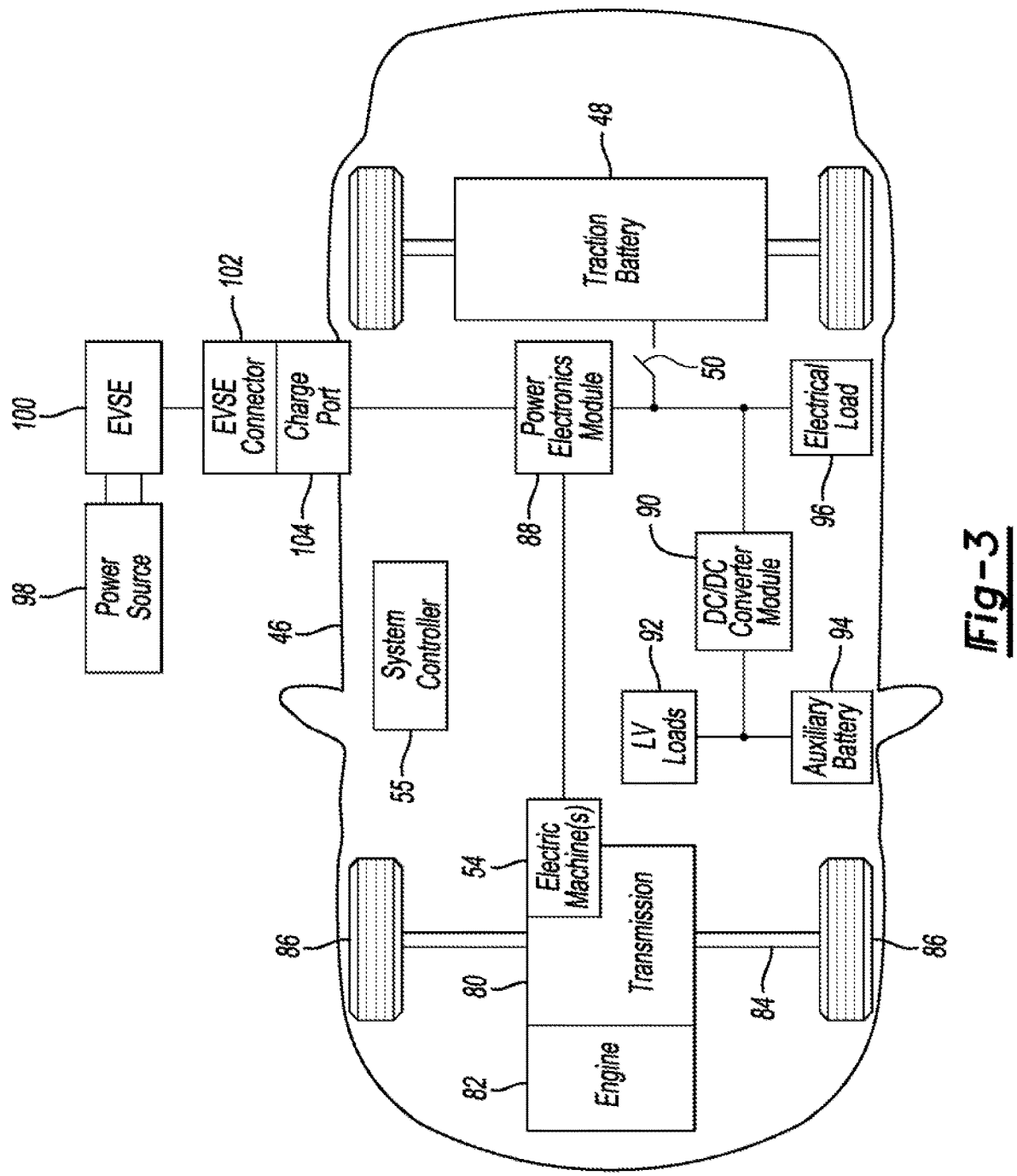
FIG. 3 is another schematic diagram of the vehicle including the power system of FIG. 2.

With regard to FIG. 3, the vehicle 46 is shown somewhat differently than in FIG. 2, and includes the electric machine 54 mechanically coupled to a hybrid transmission 80. The electric machine 54 may operate as a motor or generator. In addition, the hybrid transmission 80 is mechanically coupled to an engine 82 and a drive shaft 84 that is mechanically coupled to wheels 8.

The traction battery or battery pack 48 stores energy that can be used by the electric machine 54. The vehicle battery pack 48 may provide a high voltage direct current (DC) output. The traction battery 48 may be electrically coupled to one or more power electronics modules 88 that include the inverter 52 discussed above. The contactor circuitry 50 may isolate the traction battery 48 from other components and connect the traction battery 48 to other components as described above. The power electronics module 88 is also electrically coupled to the electric machine 54 and provides the ability to bi-directionally transfer energy between the traction battery 48 and the electric machine 54. For example, the traction battery 48 may provide a DC voltage while the electric machine 54 may operate with alternating current (AC) to function. The power electronics module 88 may convert the DC voltage to AC current to operate the electric machine 54 via the inverter 52. In regenerative mode, the power electronics module 88 may convert the AC current from the electric machine 54 acting as a generator to DC voltage compatible with the traction battery 48.

The vehicle 46 may include a variable-voltage converter (VVC) (not shown) electrically coupled between the traction battery 48 and power electronics module 88. The VVC may be a DC/DC boost converter configured to increase or boost the voltage provided by the traction battery 48. By increasing the voltage, current requirements may be decreased leading to a reduction in wiring size for the power electronics module 88 and the electric machine 54. Further, the electric machines 54 may be operated with better efficiency and lower losses.

In addition to providing energy for propulsion, the traction battery 48 may provide energy for other vehicle electrical systems. The vehicle 46 may include a DC/DC converter module 90 that converts the high voltage DC output of the traction battery 48 to a low voltage DC supply that is compatible with low-voltage vehicle loads 92. An output of the DC/DC converter module 90 may be electrically coupled to an auxiliary battery 94 (e.g., 12V battery) for charging the auxiliary battery 94. The low-voltage systems may be electrically coupled to the auxiliary battery 94. One or more electrical loads 96 may be coupled to the high-voltage bus. The electrical loads 96 may have an associated controller that operates and controls the electrical loads 96 when appropriate. Examples of electrical loads 96 may include a fan, an electric heating element, and/or an air-conditioning compressor.

The electrified vehicle 46 may be configured to recharge the traction battery 48 from an external power source 98. The external power source 98 may be a connection to an electrical outlet. The external power source 98 may be electrically coupled to a charger or electric vehicle supply equipment (EVSE) 100. The external power source 98 may be an electrical power distribution network or grid as provided by an electric utility company. The EVSE 100 may provide circuitry and controls to regulate and manage the transfer of energy between the power source 98 and the vehicle 46. The external power source 98 may provide DC or AC electric power to the EVSE 100. The EVSE 100 may have a charge connector 102 for plugging into a charge port 104 of the vehicle 46. The charge port 104 may be any type of port configured to transfer power from the EVSE 100 to the vehicle 46. The EVSE connector 102 may have pins that mate with corresponding recesses of the charge port 104. Alternatively, various components described as being electrically coupled or connected may transfer power using a wireless inductive coupling.

In some configurations, the electrified vehicle 46 may be configured to provide power to an external load. For example, the electrified vehicle 46 may be configured to operate as a back-up generator or power outlet. In such applications, a load may be connected to the EVSE connector 102 or other outlet. The electrified vehicle 46 may be configured to return power to the power source 98. For example, the electrified vehicle 46 may be configured to provide alternating current (AC) power to the electrical grid. The voltage supplied by the electrified vehicle 46 may be synchronized to the power line.

Electronic modules in the vehicle 46 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by the Institute of Electrical and Electronics Engineers (IEEE) 802 family of standards. Additional channels of the vehicle network may include discrete connections between modules and may include power signals from the auxiliary battery 94. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown but it may be implied that the vehicle network may connect to any electronic module that is present in the vehicle 46. A vehicle system controller may be present to coordinate the operation of the various components.

The vehicle 46 also includes the DC/DC converter module 90 for converting the voltage of the high-voltage bus to a voltage level suitable for the auxiliary battery 94 and low-voltage loads 92 (e.g., around 12 Volts). The vehicle 46 may further include additional switches, contactors, and circuitry to selectively select power flow between the traction battery 48 to the DC/DC converter 90.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
a battery;
an inverter; and
a controller configured to,
close a pre-charge contactor and one of a pair of main contactors to electrically connect the battery and inverter such that current flows through a pre-charge resistor,
open the pair of main contactors to electrically disconnect the battery and inverter, and close a switch configured to complete a circuit such that charge acquired by a capacitor of the inverter is dissipated via the pre-charge resistor, and
open the switch upon expiration of a predefined time period that begins with opening the pair to electrically disconnect the battery and inverter.

2. The vehicle of claim 1, wherein the controller is further configured to open the switch responsive to the charge falling below a threshold level.

3. The vehicle of claim 1, wherein the controller is further configured to close the other of the pair of main contactors and open the pre-charge contactor responsive to the capacitor acquiring a desired charge.

4. The vehicle of claim 1, wherein the switch is a metal-oxide semiconductor field-effect transistor, an insulated-gate bipolar transistor, or a mechanical relay.

5. A method comprising:
by a controller,
closing a pre-charge contactor and one of a pair of main contactors to electrically connect a traction battery and inverter such that current from the traction battery to the inverter flows through a pre-charge resistor,
opening the pair of main contactors and closing a switch configured to complete a circuit between the pre-charge resistor and a capacitor of the inverter to dissipate charge acquired by the capacitor via the pre-charge resistor, and
opening the switch upon expiration of a predefined time period that begins with opening the pair to electrically disconnect the traction battery and inverter.

6. The method of claim 5 further comprising opening the switch responsive to the charge falling below a threshold level.

7. The method of claim 5 further comprising closing the other of the pair of main contactors and opening the pre-charge contactor responsive to the capacitor acquiring a desired charge.

8. The method of claim 5, wherein the switch is a metal-oxide semiconductor field-effect transistor, an insulated-gate bipolar transistor, or a mechanical relay.

9. A vehicle power system comprising:
a traction battery;
an inverter; and
a controller configured to
open a pair of main contactors to electrically disconnect the traction battery and inverter, and to then close a switch configured to complete a circuit such that charge acquired by a capacitor of the inverter is dissipated via a pre-charge resistor electrically between the traction battery and capacitor, and
open the switch upon expiration of a predefined time period that begins with opening the pair to electrically disconnect the traction battery and inverter.

10. The vehicle power system of claim 9, wherein the controller is further configured to close a pre-charge contactor and one of the pair of main contactors to electrically connect the traction battery and inverter.

11. The vehicle power system of claim 10, wherein the controller is further configured to close the other of the pair of main contactors and open the pre-charge contactor responsive to the capacitor acquiring a desired charge.

12. The vehicle power system of claim 9, wherein the controller is further configured to open the switch responsive to the charge falling below a threshold level.

13. The vehicle power system of claim 9, wherein the switch is a metal-oxide semiconductor field-effect transistor, an insulated-gate bipolar transistor, or a mechanical relay.

* * * * *